United States Patent [19]
Borgen

[11] Patent Number: 5,311,180
[45] Date of Patent: May 10, 1994

[54] DIGITAL CIRCUIT FOR THE INTRODUCTION AND LATER REMOVAL OF DITHER FROM AN ANALOG SIGNAL

[75] Inventor: Gary S. Borgen, Camarillo, Calif.

[73] Assignee: The United States of America as represented by the Secretary of the Navy, Washington, D.C.

[21] Appl. No.: 4,004

[22] Filed: Jan. 15, 1993

[51] Int. Cl.$^5$ ............................................. H03M 1/20
[52] U.S. Cl. ..................................... 341/131; 341/110
[58] Field of Search ........................ 341/110, 118, 131

[56] References Cited

U.S. PATENT DOCUMENTS

| | | | |
|---|---|---|---|
| 4,700,173 | 10/1987 | Araki et al. | 341/131 |
| 4,812,846 | 3/1989 | Noro | 341/131 |
| 4,914,439 | 3/1990 | Nakahashi et al. | 341/131 |
| 4,965,668 | 10/1990 | Abt et al. | 358/160 |
| 4,994,803 | 2/1991 | Blackham | 341/131 |
| 5,187,481 | 2/1993 | Hiller | 341/131 |

OTHER PUBLICATIONS

Robert Alexander Wannamaker, Dither & Noise Shaping in Audio Application, 1991.

Primary Examiner—Marc S. Hoff
Attorney, Agent, or Firm—David S. Kalmbaugh; Melvin J. Sliwka; John Forrest, Jr.

[57] ABSTRACT

An electronics circuit for accurately digitizing an analog audio or like data signal into a digital equivalent signal by introducing dither into the analog signal and then subsequently removing the dither from the digitized signal prior to its conversion to an analog signal which is a substantial replica of the incoming analog audio or like data signal. The electronics circuit of the present invention is characterized by a first pseudo-random number generator which generates digital random noise signals or dither for addition to the digital equivalent signal and a second pseudo-random number generator which generates subtractive digital random noise signals for the subsequent removal of dither from the digital equivalent signal prior its conversion to the analog replica signal.

10 Claims, 6 Drawing Sheets

DIGITAL CIRCUIT FOR THE INTRODUCTION AND LATER REMOVAL OF DITHER FROM AN ANALOG SIGNAL

BACKGROUND OF THE INVENTION

1. Field of the Invention

The present invention relates generally to the conversion of electric signals from analog to digital form. More specifically, the present invention relates to a digital circuit for translating an analog audio or like analog signal into an equivalent digital signal with the addition of dither which is an artificially created noise signal and then subsequently removing the dither from the digital signal thereby reducing noise and distortion.

2. Description of the Prior Art

The pulse code modulation (PCM) or digital processing of analog audio signals has become, or is becoming, the mainstream of high fidelity sound recording and reproduction with the advent and ever increasing commercial acceptance of compact discs. The digital processing of analog signals in the low to high frequency range is also becoming highly useful for analyzing the performance of weapons systems such as guided missiles. For example, the analog data acquired by a guided missile during flight is converted to its digital equivalent and then placed in a digital PCM frame for transmission to a ground station for analysis.

There are, however, some problems left unsolved in the art of digital processing of analog signals. For example, there is a significant difference between the samples of an analog signal and the quantized values of the samples which is generally referred to as "quantization noise". This difference becomes particularly pronounced when the input analog signal is low and there are only a small number of quantization steps, thereby, for example, distorting the reproduced sound as higher harmonics in high fidelity sound systems.

A prior art solution to this quantization noise problem has been the use of dither which is intended to turn the quantization noise into broad band white noise which has little or no effect on reproduced sound or the like and which is generally referred to as "white noise". One system of the prior art adds an analog dither signal, converted from the output from a digital dither generator by a digital to analog converter, to the incoming analog audio or analog data signal. The combined analog data and dither is digitized by an analog to digital converter and then fed to a subtractor circuit. The subtractor is also supplied the digital dither directly from the dither generator. The subtractor circuit then subtracts the dither component from the digital data and dither signal.

A second system of the prior art uses an analog dither generator in combination with a second analog to digital converter for digitizing the analog dither prior to its delivery to the subtractor. In this prior art system, analog dither is added directly to the analog data signal. The resulting dither added data signal is then digitized by the first analog to digital converter and the analog dither is digitized by the second analog to digital converter preparatory to application to the two inputs of the subtractor circuit.

While partially satisfactory for their intended purpose of removing noise and distortion from a digitized analog signal, these prior art systems ordinarily leave something to be desired in that dither components remain in the digitized data signal which manifest themselves as noise or distortion upon sound reproduction or reproduction as an analog signal for visualization and subsequent analysis. In addition, prior art systems for removing noise and distortion from a digitized analog signal often use digital signal processors as dither signal generators. Thus, such prior art systems are often complex in design as well as being expensive to manufacture.

Accordingly, it is an object of the present invention to provide an electronics circuit for accurately converting an analog audio or like data signal into its digital equivalent.

It is another object of the present invention to provide an electronics circuit for adding dither to an analog audio or like data signal and then removing dither from the digital equivalent signal and then converting the digital signal to an analog signal which is a replica of the analog audio or like data signal.

It is a further object of the present invention to provide a reliable yet relatively simplistic and inexpensive electronics circuitry for converting an analog audio or like data signal into its digital equivalent and then reconverting the digital equivalent signal to its analog equivalent signal by the removal of dither from the digital equivalent signal.

It is yet a further object of the present invention to provide electronics circuitry which is capable of operation with high resolution and conversion accuracy.

The above and other novel features and advantages of the present invention and the manner of realizing them will become more apparent and the invention will be best understood from a study of the following description and appended claims, with reference to the attached drawings.

SUMMARY OF THE INVENTION

According to the present invention, briefly stated, there is provided an electronics circuit for accurately digitizing an analog audio or like data signal into a digital equivalent signal by introducing dither into the digital equivalent signal and then subsequently removing the dither from the digital equivalent signal prior to its conversion to an analog signal which is a substantial replica of the incoming analog audio or like data signal. The electronics circuit of the present invention is characterized by a first pseudo-random number generator which generates digital random noise signals or dither for addition to the digital equivalent signal and a second pseudo-random number generator which generates subtractive digital random noise signals for the subsequent removal of dither from the digital equivalent signal prior to conversion of the digital equivalent signal to the analog replica signal.

The present invention is further characterized by a first clipping circuit which clips the digital equivalent signal with dither introduced to a maximum binary value having every bit at the logic one state and a minimum binary value having every bit at the logic zero state and a second clipping circuit which clips the digital equivalent signal with dither removed therefrom to a maximum binary value having every bit at the logic one state and a minimum binary value having every bit at the logic zero state.

DETAILED DESCRIPTION OF THE PREFERRED EMBODIMENT

Figure 1:
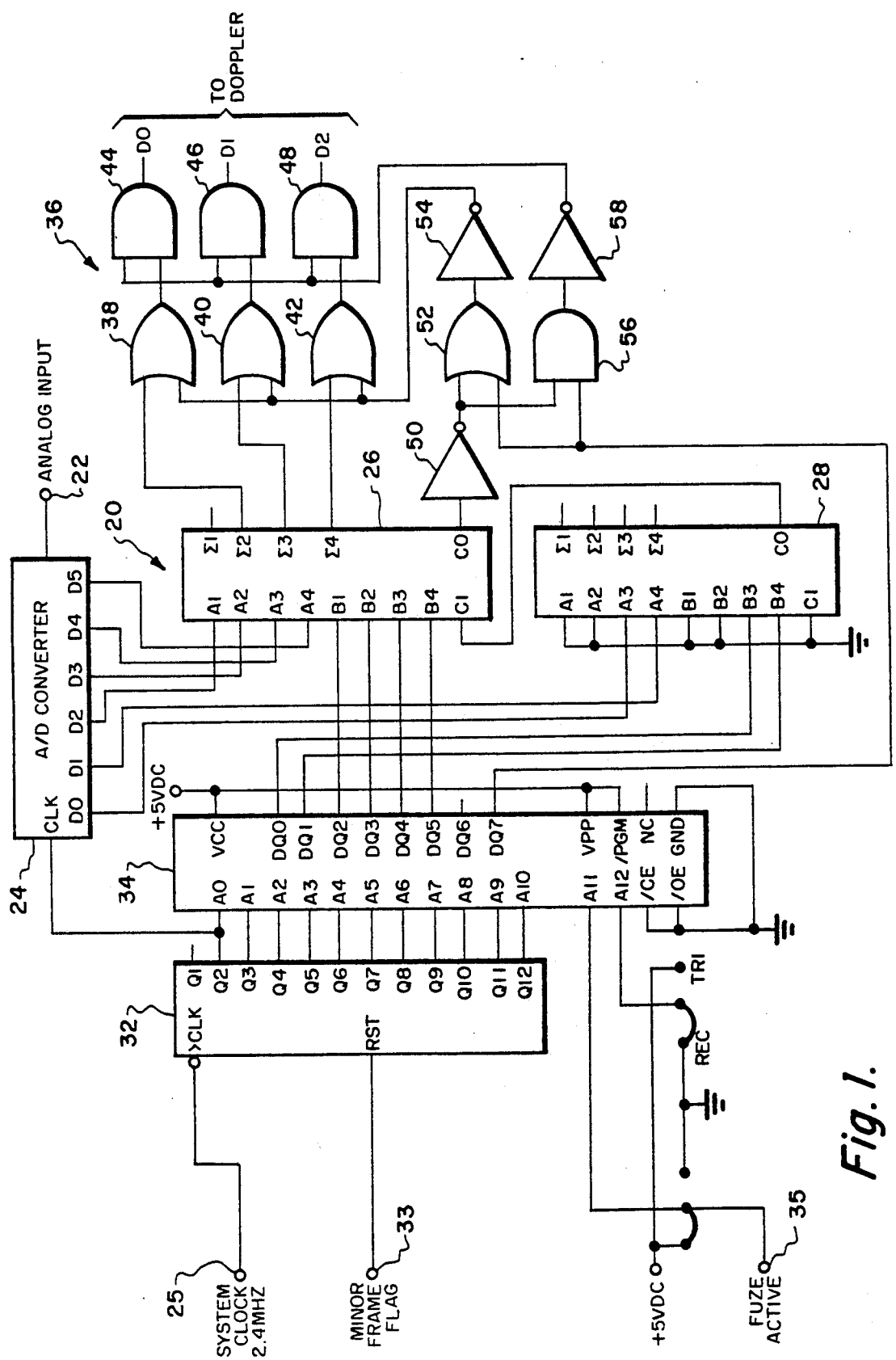
FIG. 1 is a circuit diagram of the digital circuit for the introduction of dither to an audio or analog data signal comprising the present invention.

The present invention will now be described in terms of the preferred embodiment thereof illustrated in FIGS. 1 and 2, in which the electronics circuits, designated respectively by the reference numerals 20 and 21, are shown as adapted for use in the pulse code modulation of an analog data signal, analog audio signal or the like and the subsequent removal of dither from the digitized equivalent signal.

Figure 2:
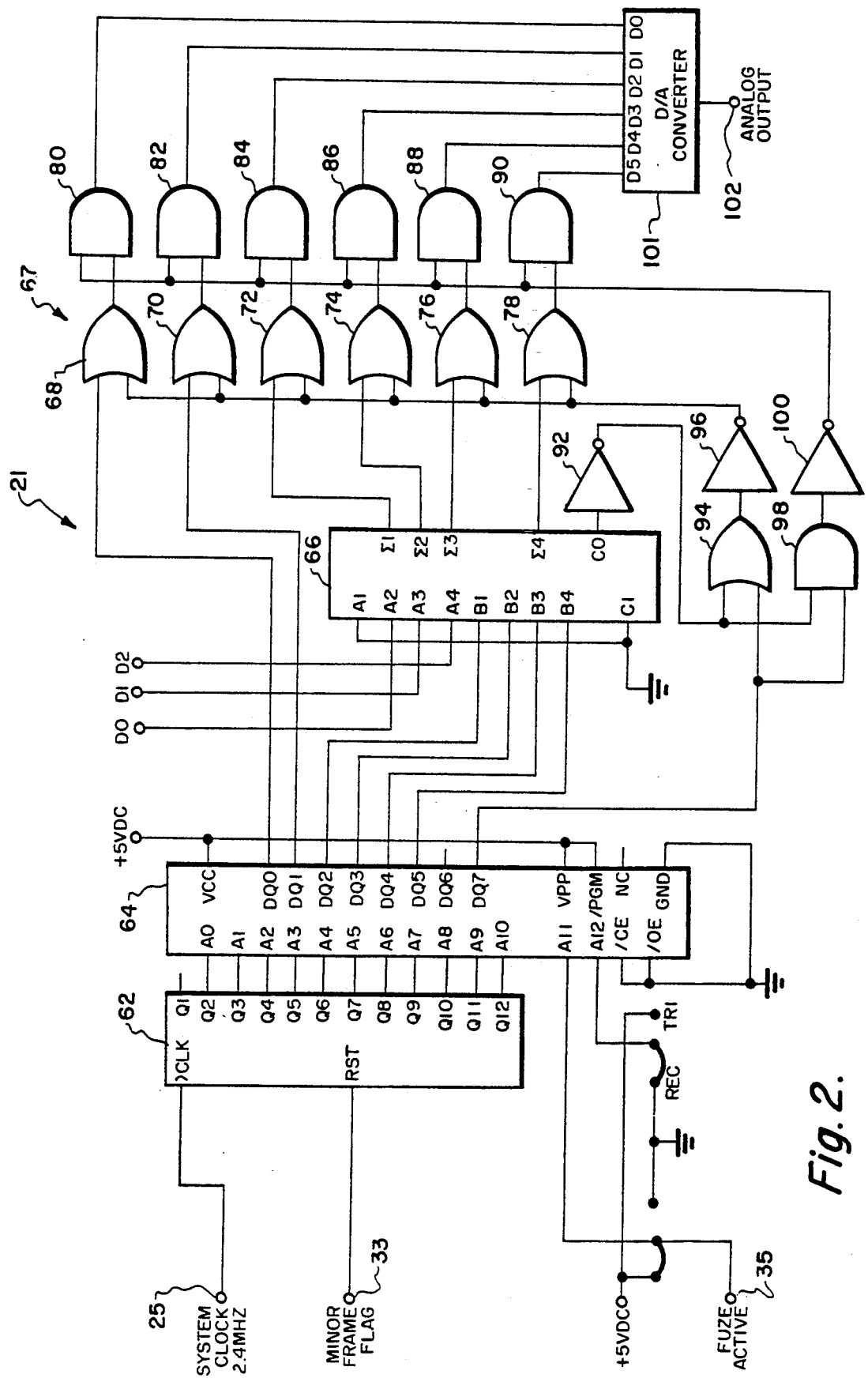
FIG. 2 is a circuit diagram of the digital circuit for the removal of dither from the digitized equivalent signal generated by the circuit of FIG. 1.

The reference numeral 22 in FIG. 1 denotes an input terminal for inputting the analog audio or analog data signal. The analog data/video doppler signal provided to the electronics circuit 20 of the present invention is the tracking information from a missile in flight which is to be digitized and then forwarded via the missile's telemetry unit to a ground station for analysis. However, it should be understood that the term "data signal" may mean any analog signal that can be processed by means of the present invention and which may have a frequency in the low to high frequency range as well as the audio frequency range.

The analog data signal is first provided to an analog to digital converter 24 which converts the analog data signal to an equivalent six bit digital signal or word with the four most significant bits (MSB) of the signal being supplied to the A1-A4 inputs of a four bit binary full adder 26, while the two least significant bits (LSB) of the signal are supplied to the A3 and A4 inputs of a four bit binary full adder 28. The conversion or sampling rate of analog to digital converter 24 is 600 KHz with the 600 KHz sampling/clock signal being supplied by an asynchronous twelve bit counter 32.

At this time, it should be noted that there is a limitation in bandwidth at which the digitized information may be transmitted to the ground station because of National Telecommunications and Information Administration frequency allocation limitations as well as limitations in the ground station's data receiving and processing capabilities. As a result of these limitations electronics circuit 20 provides a maximum three bit digitized word for each six bit digitized sample of the analog data signal supplied to analog to digital converter 24.

A 2.4 megahertz system clock signal from the missile telemetry receiver, bit synchronizer and decommutator, not illustrated, is supplied via terminal 25 the clock input of asynchronous twelve bit counter 32. Counter 32 in response to the 2.4 megahertz clock signal supplies addressing to the A0-A10 inputs of a pseudo-random number generator 34 which generates random binary numbers by utilizing the computer software program set forth in Appendix A.

The computer software of Appendix A uses the following equation to generate a periodic pseudo-random sequence of positive integers, $I_n$:

$$I_{n+1} = (JI_n + 1) \text{ modulo } M, \quad n = 0,1,2,\ldots,M-1 \quad (1)$$

where J is a selected integer value and the initial value $I_0$ is arbitrary. The period of the sequence must be less than or equal to M and may be defined precisely as M if $$J = 4K + 1 \quad (2)$$

and $$M = 2^L \quad (3)$$

where K and L are integers such that $M > J$ and L represents the word length of each random number in a binary format. The word length of the random number is provided in response to thirteen bit address supplied to the A0-A12 inputs of pseudo-random number generator 34 with the eleven least significant bits of the address being supplied by counter 32, the twelfth bit of the address being supplied by the fuze active output terminal 35 of the missile's telemetry unit and the thirteenth bit of the address being connected to either ground or +5VDC. When the twelfth bit of the address is a logic one, circuit 20 will provide a three bit equivalent digital signal for each sample of the analog signal occurring at input terminal 22, while a logic zero at the A11 input of generator 34 indicates that a one bit equivalent digital signal of the analog signal occurring at terminal 22 is being processed by the missile's telemetry unit and circuit 20.

The random number generated by random number generator 34 is a six bit binary number which occurs at the DQ0-DQ5 outputs of generator 34 and which may be either positive or negative. The logic signal provided at the DQ7 output of generator 34 indicates whether the random number is positive or negative with a logic zero indicating that the random number is positive and a logic one indicating that the random number is negative. When the random number generated by random number generator 34 is a negative number, the two's complement of the number will occur at the DQ0-DQ7 of generator 34.

When a three bit equivalent digital signal with dither is to be provided at the D0, D1 and D2 outputs of circuit 20, that is the A11 input of generator 34 is at the logic one state, and a logic zero is supplied to the A12 input of generator 34 indicating a Rectangular Probability Density Function, the computer software of Appendix A will limit the range of binary random numbers generated by generator 34 to the binary values set forth in the following table:

TABLE I

| DECIMAL | BINARY (DQ7-DQ0) | HEXADECIMAL |
|---|---|---|
| 3 | 00000011 | 03 |
| 2 | 00000010 | 02 |
| 1 | 00000001 | 01 |
| 0 | 00000000 | 00 |
| −1 | 11111111 | FF |
| −2 | 11111110 | FE |
| −3 | 11111101 | FD |
| −4 | 11111100 | FC |

This range limitation of random numbers is, in turn, accomplished by dividing the random number generated in accordance with equation one by a predetermined number which is 248 so that the binary random number occurring at the DQ0-DQ7 outputs of generator 34 will fall within the range limits of TABLE 1.

At this time it should be noted that the computer software of Appendix A introduces optimum dither into the three bit or one bit digital equivalent signal of the analog signal occurring at terminal 22. For a Rectangular Probability Density Function and a three bit equivalent digital signal, the computer software of Appendix A allows generator 34 to generate a random binary number from TABLE I for each address supplied to the A0-A12 inputs of generator 34. Similarly, for a Rectangular Probability Density Function and a one bit equivalent digital signal, the computer software of Appendix A allows generator 34 to generate a random binary number between +15 (00001110) and −16 (11110000).

Whenever the A12 input of generator 34 is connected to +5VDC a Triangular Probability Density Function will be processed by generator 34, thereby allowing optimum dither to be introduced into the three bit or one bit digital equivalent signals of the analog signal occurring at terminal 22. For a Triangular Probability Density Function and a three bit equivalent digital signal, the computer software of Appendix A allows generator 34 to generate a random binary number between +8 (00001000) and −8 (11111000) for each address supplied to the A0-A12 inputs of generator 34. Similarly, for a Triangular Probability Density Function and a one bit digital equivalent signal, the computer software of Appendix A allows generator 34 to generate a random binary number between +32 (00100000) and −32 (11100000).

A thorough discussion of the addition of digital dither to a pulse code modulated audio or other analog signal may be found in a publication entitled "Dither and Noise Shaping, in Audio Applications" by Robert R. Wannamaker, published in 1991 which may be obtained from the University of Waterloo, Waterloo, Ontario, Canada.

The reset input of counter 32 is connected to a minor frame flag output terminal 33 of the missile's telemetry unit. Terminal 33 provides a logic one pulse every 1920 counts of counter 32 so as to reset counter 32. It should be noted that the software of Appendix A is set to provide for a sequence of 2048 counts, that is M equals 2048.

At this time it should also be noted that the pseudo-random number generators 34 and 64 used in the preferred embodiment of the present invention are Texas Instruments 65,536 Bit Programmable Read Only Memories, Model Number TMS27C64 although it should be understood that any digital signal processing device which is capable of generating dither in the manner set forth above may be used as generators 34 and 64. It should also be noted that the binary adders 26, 28 and 66 used in the preferred embodiment of the present invention are Texas Instruments 4-Bit Binary Full Adders, Model Number SN45HC283.

Binary adders 26 and 28 introduce the six bit dither signal or word provided by generator 34 into each sample of the digital equivalent of the analog signal supplied to terminal 22 by the missile's telemetry system. It should be noted that the 600 KHz sampling rate utilized by analog to digital converter 24 to supply digital equivalent words to adders 26 and 28 is synchronized with the rate at which generator 34 supplies dither to adders 26 and 28.

For each digital sample of the analog signal supplied to terminal 22, binary adder 26 provides a three bit digital equivalent signal with dither at its Σ2, Σ3, and Σ4 as well as a logic one carry bit indicating an overflow within adder 26. This three bit digital equivalent signal is supplied to a clipping circuit 36 which will process the three bit digital equivalent signal with dither in accordance with the following logic equations:

$$A = CO\text{-}/DO7 \qquad (4)$$

$$B = CO + /DO7 \qquad (5)$$

where A indicates whether the three bit digital equivalent signal will pass through OR gates 38, 40 and 42 and B indicates whether the three bit digital equivalent signal will pass through AND gates 44, 46 and 48.

When DQ7 of generator 34 is at the logic zero state indicating a positive dither value and the carry output of binary adder 26 is at the logic zero state, a logic one will occur at the output of OR gate 52. This logic one is then inverted by inverter 54 so that logic zeros are supplied to the first inputs of OR gates 38, 40 and 42 allowing the three bit digital equivalent signal from the Σ2, Σ3, and Σ4 outputs of binary adder 26 to pass through OR gates 38, 40 and 42. Since the DQ7 output of generator 34 is at the logic zero state, the output of AND gate 56 is also at the logic zero state resulting in a logic one at the output of inverter 58. This logic one is supplied to AND gates 44, 46 and 48 thereby enabling AND gates 44, 46 and 48 which allows the three bit digital equivalent signal to pass therethrough to the D0, D1 and D2 outputs of circuit 20.

In a like manner, whenever the CO output of binary adder 26 is at the logic one state and the DQ7 output of generator 34 is at the logic one state the three bit digital equivalent signal will pass from the Σ2, Σ3 and Σ4 outputs of binary adder 26 respectively through OR gates 38, 40 and 42 and AND gates 44, 46 and 48 to the D0, D1 and D2 outputs of circuit 20. This indicates that the three bit digital equivalent signal occurring at the Σ2, Σ3, and Σ4 outputs of binary adder 26 is positive even though a negative binary value for dither was added to the six bit digital word provided by analog to digital converter 24.

However, when the carry output of binary adder 26 is at the logic one state and the DQ7 output of generator 34 is at the logic zero state, the output of OR gate 52 will be at the logic zero state. This logic zero is inverted by inverter 54 and then supplied to OR gates 38, 40 and 42 resulting in logic ones occurring at the outputs OR gates 38, 40 and 42 which are then provided to AND gates 44, 46 and 48. Since the output of AND gate 56 is at the logic zero state, inverter 58 will supply a logic one to AND gates 44, 46 and 48 which will each pass the logic one therethrough resulting in logic ones occurring at the D0, D and D2 outputs of circuit 20. This is the maximum three bit digital equivalent signal with dither that circuit 20 can provide for a digital sample of the analog signal supplied to terminal 22.

Further, when the carry output of adder 26 is at the logic zero state and the DQ7 output of generator 34 is a logic one the negative binary value of the dither signal generated by generator 34 will exceed the positive value of the six bit digital equivalent word from analog to digital converter 24 resulting in a negative binary number being provided by binary adders 26 and 28. Inverter 50 inverts the logic zero supplied to the input thereof resulting in logic ones being supplied to the first and second inputs of AND gate 56 which, in turn, results in a logic one occurring at the output of AND gate 56. This logic one is next supplied to and then inverted by inverter 58 resulting in a logic zero being supplied to AND gates 44, 46 and 48 so as to inhibit AND gates 44, 46 and 48 which then results in clipping circuit 36 supplying logic zeros to the D0, D1 and D2 outputs of circuit 20.

The three bit digital equivalent digital signal with dither which occurs at the D0, D1 and D2 outputs of circuit 20 is supplied to packing logic within the missile's telemetry unit which prepares the three bit digital equivalent digital signal for transmission to a ground station by an antenna. Located at the ground station is the electronics circuit 21 of FIG. 2 which is adapted to receive the three bit digital equivalent signal and subtract therefrom the dither component of the signal provided by pseudo-random number generator 34.

The 2.4 megahertz system clock signal is also supplied via terminal 25 twelve bit counter 62. Counter 62 in response to the 2.4 megahertz clock signal supplies addressing to the A0-A10 inputs of a pseudo-random number generator 64 which generates random binary numbers by utilizing the computer software program set forth in Appendix B.

For each binary random number generated by pseudo-random number generator 34, pseudo random number generator 64 will generate its negative equivalent binary number delayed by a count of one clock pulse of the 600 KHz clock signal provided at the Q2 output of counter 34. The negative equivalent binary number generated by pseudo random number generator 64 is, in turn, the two's complement of the binary number generated by pseudo random number generator 34. Thus, for example, if the random number generated by generator 34 is 00000011 which is hexadecimal 03 (Table I), generator 64 provides at its DQ0-DQ7 outputs the binary number 11111101 two's complement of hexadecimal 03) delayed by a count of one clock pulse of the 600 Khz clock signal.

The two least significant bits (bits 0 and 1) of each random number generated by generator 64 are respectively supplied to OR gates 68 and 70, while bits 2, 3, 4 and 5 of each random number are supplied respectively to the B1, B2, B3 and B4 inputs of a four bit binary full adder 66. Adder 66 then introduces bits 2, 3, 4 and 5 of each random number generated by generator 64 into the three bit digital equivalent signal with dither supplied from circuit 20, FIG. 1, thereby removing the digital dither component from each sample of the signal. The resultant six bit digital signal is then processed by a clipping circuit 67 in accordance with equations four and five with the six bit digital signal passing through OR gates 68-78 and then passing through AND gates 80-90 to the D0-D5 inputs of digital to analog converter 101 whenever A is a logic zero and B is a logic one. It should be noted that whenever the carry output (CO) of adder 66 is a logic one and the D07 output of generator is a logic zero clipping circuit 67 provides logic ones to the D0-D5 inputs of digital to analog converter 101, while a logic zero at the carry output of adder 66 and a logic one at the DQ7 output of generator 64 will result in logic zeros being supplied to the D0-D5 inputs of digital to analog converter 101. Digital to analog converter 101 then provides at terminal 102 a replica of the input analog signal supplied to terminal 22.

Figure 3:
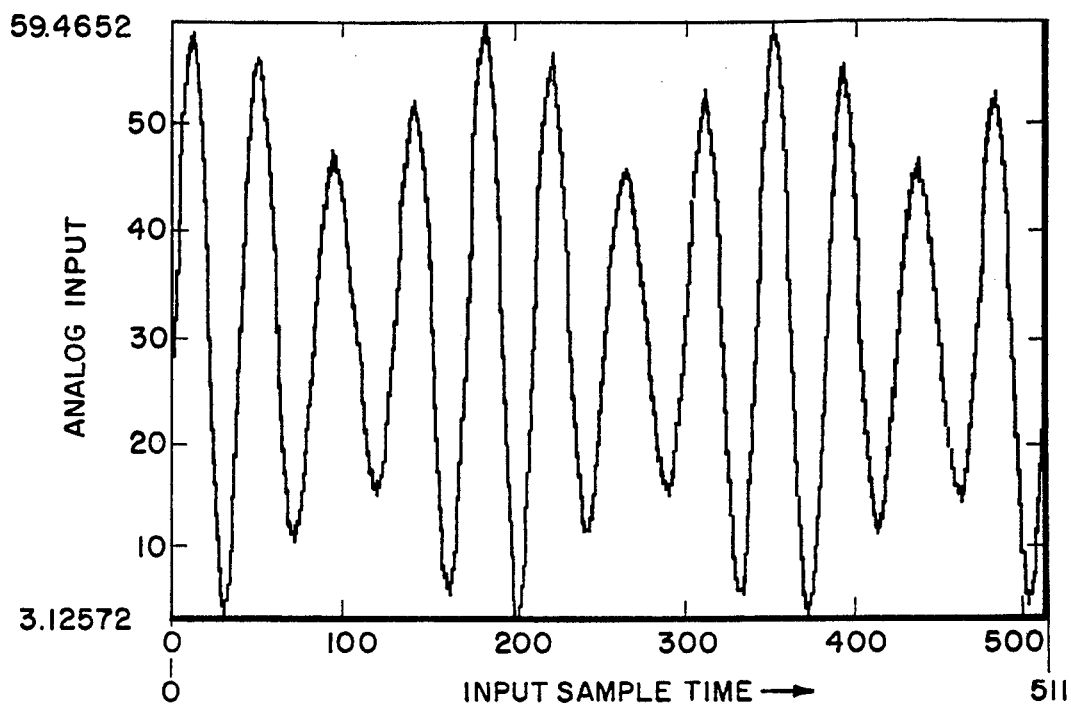
FIG. 3 illustrates the analog signal provided to the circuit of FIG. 1.
Figure 4:
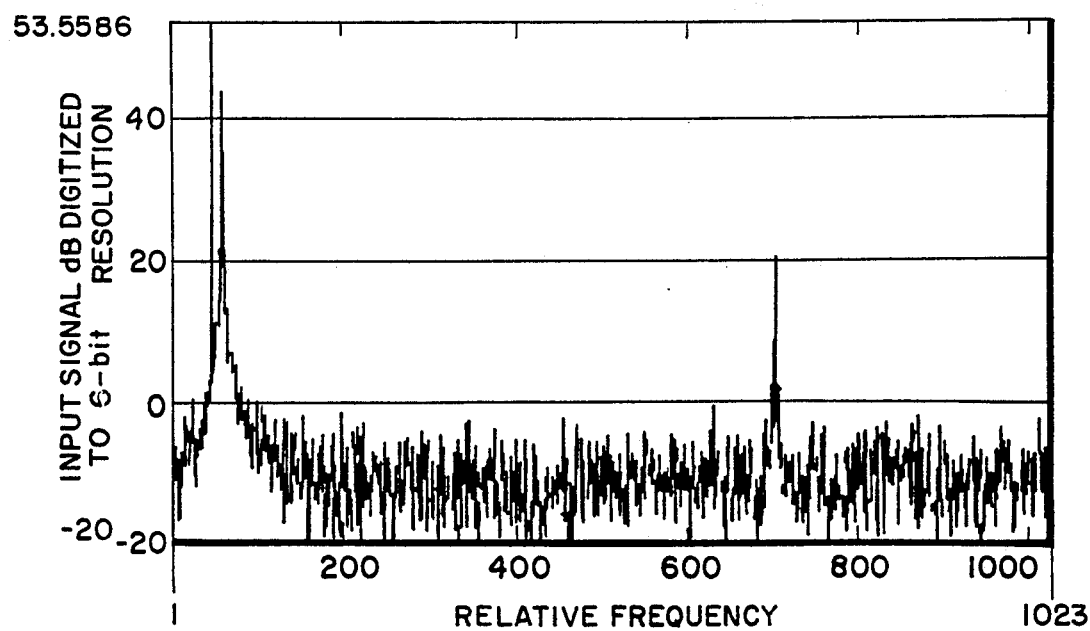
FIG. 4 illustrates a spectrum analysis of the analog signal of FIG. 3.
Figure 5:
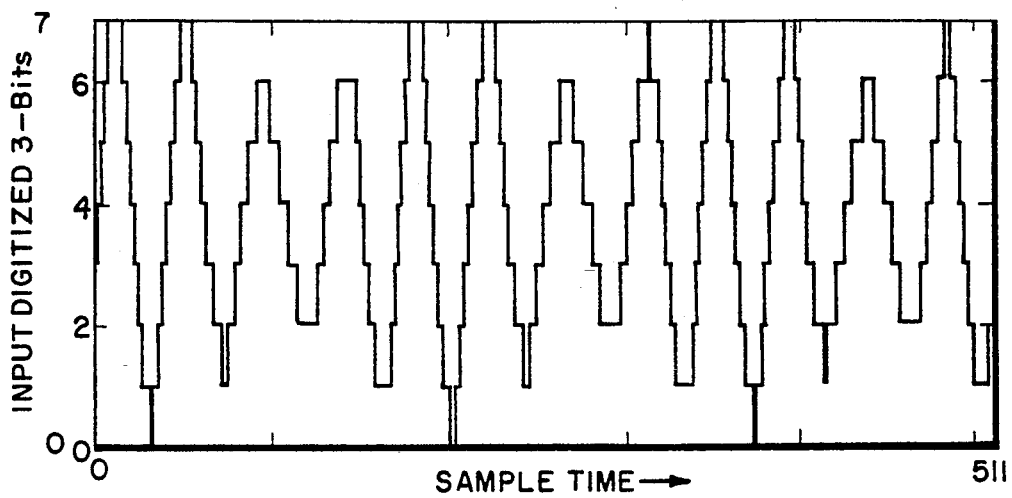
FIG. 5 illustrates the analog signal of FIG. 3 digitized to three bits by the circuit of FIG. 1.
Figure 6:
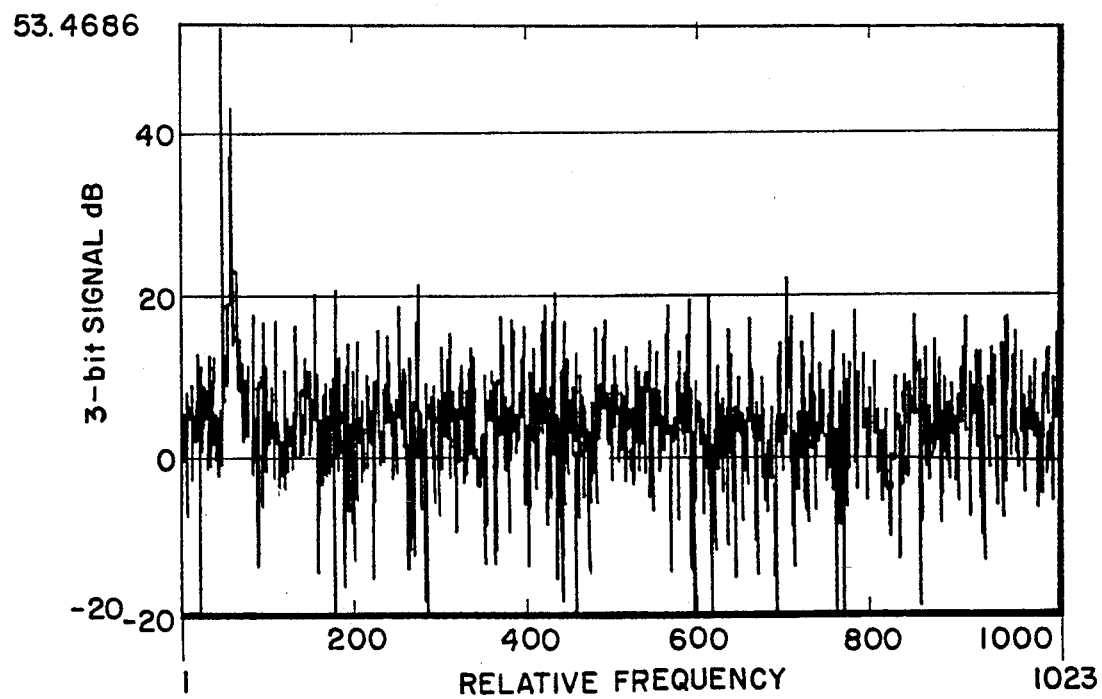
FIG. 6 illustrates a spectrum analysis of the digitized signal of FIG. 5.
Figure 7:
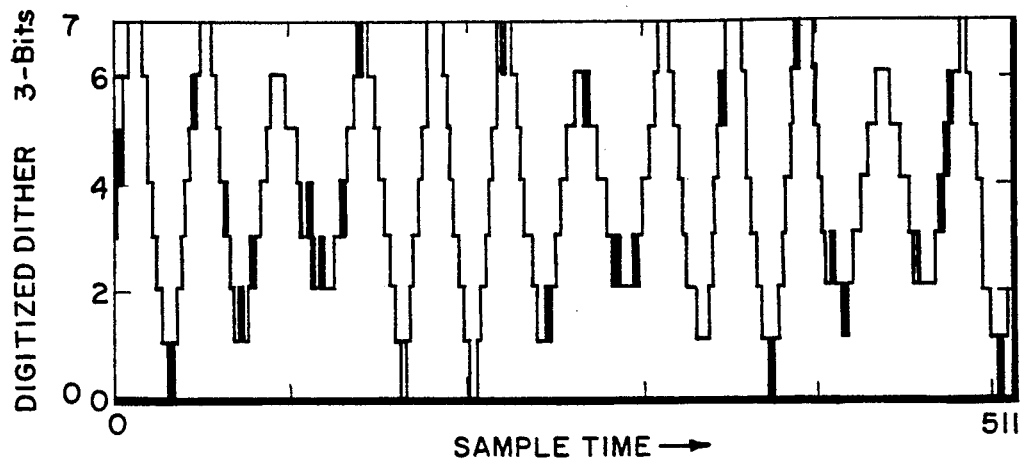
FIG. 7 illustrates the analog signal of FIG. 3 digitized to three bits with dither introduced by the circuit of FIG. 1.
Figure 8:
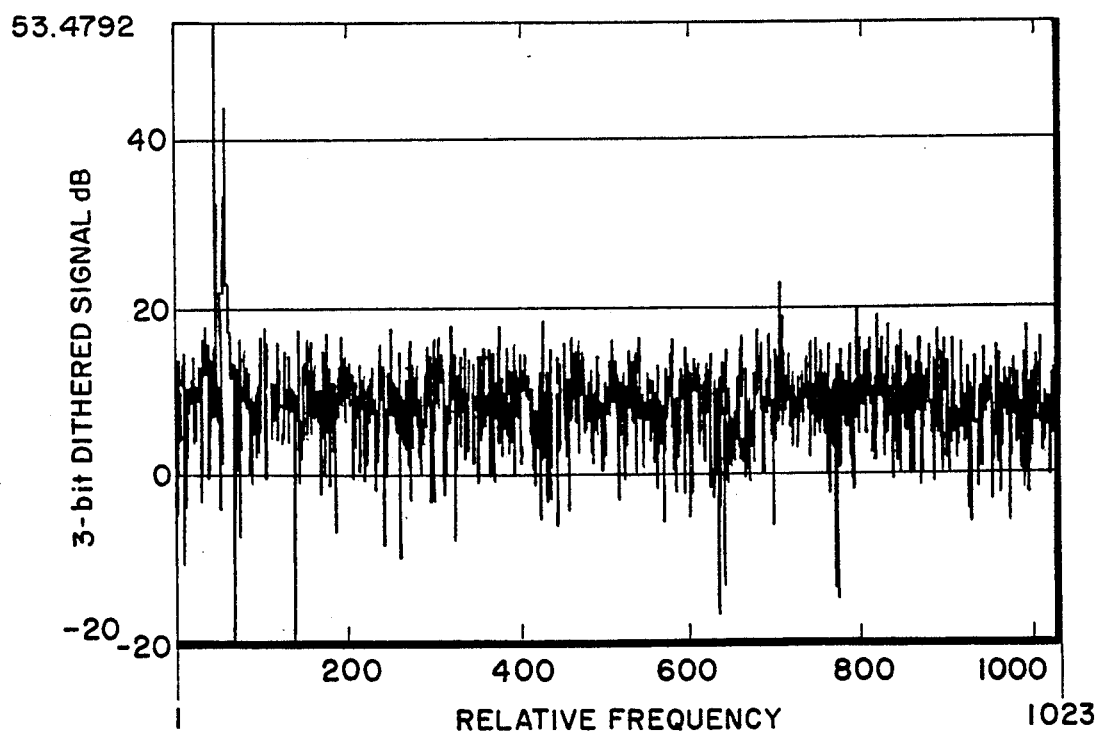
FIG. 8 is a spectrum analysis of the signal of FIG. 7.
Figure 9:
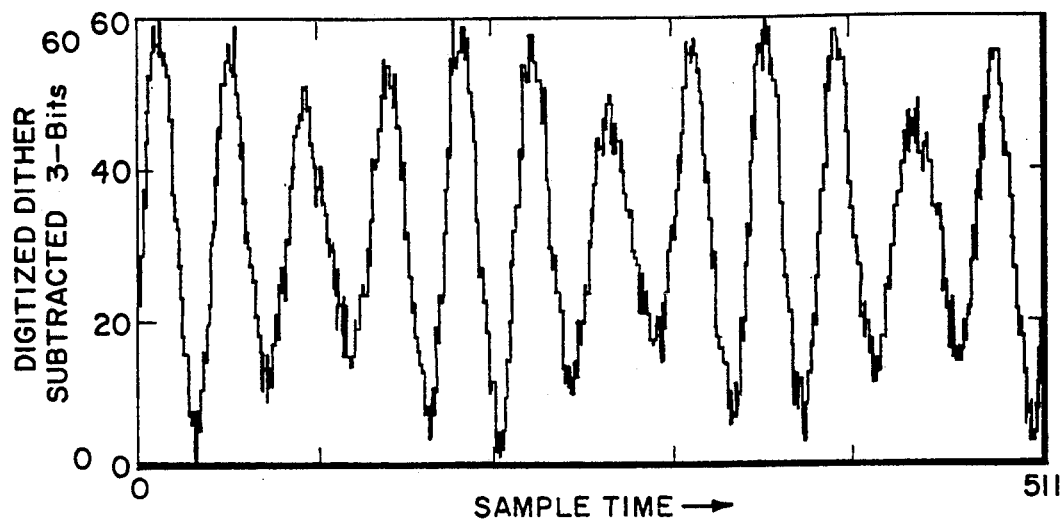
FIG. 9 illustrates the replica of the analog signal of FIG. 3 occurring at the analog output of the circuit of FIG. 2.
Figure 10:
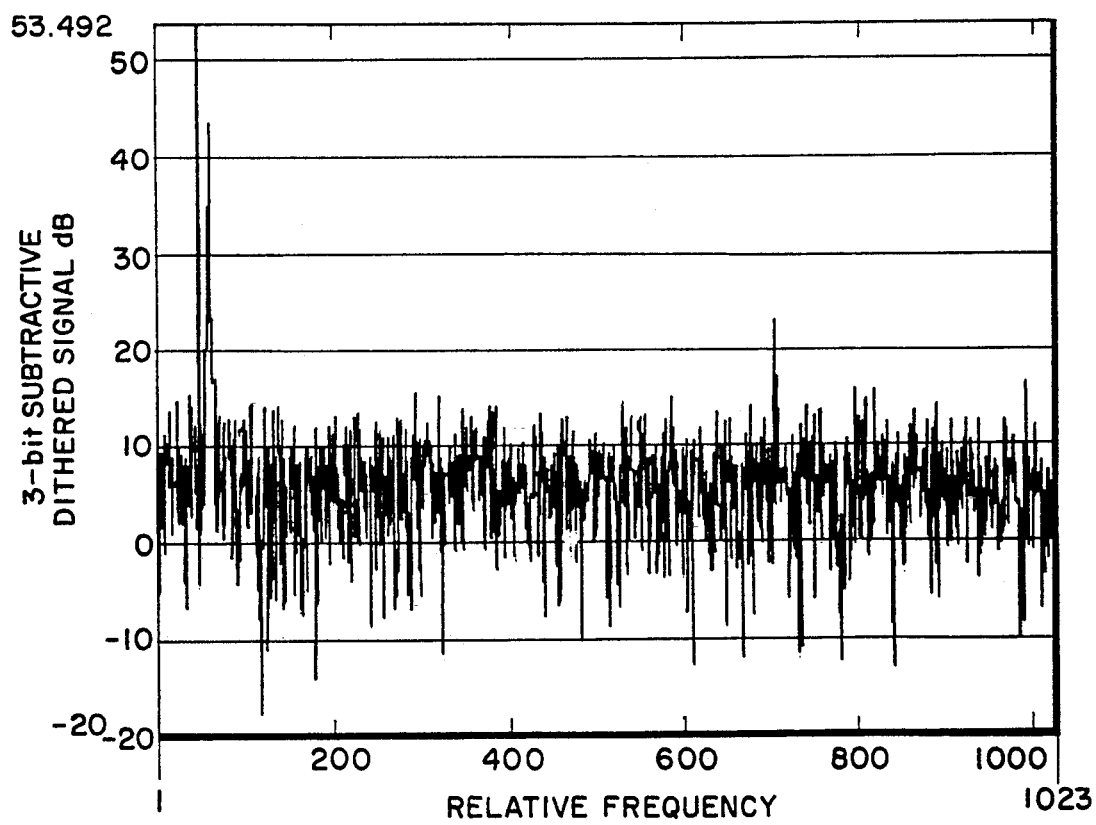
FIG. 10 is a spectrum analysis of the signal of FIG. 9.

Referring to FIGS. 3-10 there is shown a three bit digitized signal without dither and a three bit digitized signal with dither added thereto and subsequently removed therefrom. FIG. 3 is a visual illustration or display provided by an oscilloscope of the analog signal supplied to analog input terminal 22. FIG. 4 is a visual display provided by a spectrum analyzer of the amplitude versus frequency of the analog signal supplied to analog input terminal 22. FIG. 5 is a visual display provided by an oscilloscope of the analog signal of FIG. 1 digitized to three bits, while FIG. 7 is a visual display of the three bit digitized signal with dither occurring at the D0, D1 and D2 outputs of circuit 20 and FIG. 9 is a visual display of the replica occurring at terminal 102 of the analog signal of FIG. 3. FIGS. 6, 8 and 10 respectively are the amplitude versus frequency displays of the signals of FIGS. 5, 7 and 9 with the displays of FIGS. 6, 8 and 10 being provided by a spectrum analyzer. It should be noted that the display of FIG. 10 closely approximates the display of FIG. 4 thereby illustrating the effectiveness of the circuits of FIGS. 1 and 2 in removing noise and distortion from the replica analog signal occurring at the output terminal 102. It should further be noted that a three bit digitized signal without the addition and subsequent removal of dither provides a replica signal which does not substantially suppress quantized noise as is best illustrated by a comparison of FIGS. 4 and 6.

Although the present invention is described in terms of but one embodiment thereof, it needs to be recognized that the present invention could be embodied in other forms within the broad teachings set forth herein. The teachings of the present invention may be adapted to any audio recording or playback system which requires a truncating or a rounding operation to the digital equivalent signal. For instance, the teachings of the present invention may be adapted to a compact disk system, which requires twenty bit audio data to be requantized to 16 bits before storage on a compact disk.

From the foregoing, it may readily be seen that the present invention comprises a new, unique and exceedingly useful digital circuit which may be used to add dither to the digital equivalent of an analog signal and then later remove dither from the digital signal thereby reducing noise and distortion. Obviously, many modifications and variations of the present invention are possible in light of the above teachings. It is therefore to be understood that within the scope of the present claims the invention may be practiced otherwise than as specifically described.

Appendix A

```c
for (i = 1; i < M; i++)
    {
        XI[i] = (J*XI[i-1] + 1)%M;      /* Modulus of Previous Random Number */
                                        /* Times the M.F., Plus 1 */
        R[i] = XI[i]/(M/32);            /* Clip to Plus 31 */
        if ( R[i] >= 16 )               /* format data for correct ASCII Hex output */
            {
                MT = R[i] - 16;         /* 0 to 15 */
                printf("\n0%X ", MT);
            }
        if ( R[i] < 16 )
            {
                R[i] = (R[i] - 16);     /* -1 to -16 */
                printf("\n%X ", R[i]);
            }
    }

/* Initialization for rectangular 3 bit*/

K = 109;            /* Set K multiplier */
M = 2048;           /* Set Length of sequence */
XI[0] = 2011;       /* Initialize The Random Sequence */

J = 4*K+1;          /* Calculate Multiplier Factor */

R[0] = XI[0]/(M/8) - 4;   /* Clip to Plus and Minus 4 */ printf ("\n\n$A0800,");     /* Start address for 2nd page */
printf("\n0%X ", R[0]);     /* Write 1st data word */ for (i = 1; i < M; i++)
    {
        XI[i] = (J*XI[i-1] + 1)%M;      /* Modulus of Previous Random Number */
                                        /* Times the M.F., Plus 1 */
        R[i] = XI[i]/(M/8);             /* Clip to Plus 7 */ if ( R[i] >= 4 )
            {
                MT = R[i] - 4;          /* 0 to 3 */
                printf("\n0%X ", MT);
            }
        if ( R[i] < 4 )
            {
                R[i] = R[i] - 4;        /*-1 to -4 */
                printf("\n%X ", R[i]);
```

/* Initialize for 1 bit triangular dither */

```
K = 109;            /* Set K multiplier */
K2 = 507;           /* Set K2 multiplier */
M = 2048;           /* Set Length of sequence */
XI[0] = 2011;       /* Initialize The Random Sequence */
YI[0] = 112;        /* Initialize second random sequence */

J = 4*K+1;          /* Calculate Multiplier Factor M.F. 1 */
J2 = 4*K2 +1;       /* Calculate Multiplier Factor M.F. 2 */

T[0] = ((XI[0]+YI[0])/64 - 32);    /* Calculate first random number */ printf ("\n\n$A1000,");            /* Start address for 3rd page */ printf("\n0%X ", T[0]);            /* Print First Random Number */ for (i = 1; i < M; i++)
    {
    XI[i] = (J*XI[i-1] + 1)%M;     /* Modulus of Previous Random Number 1 */
                                   /* Times the M.F., Plus 1 */
    YI[i] = (J2*YI[i-1] + 1)%M;    /* Modulus of Previous Random Number 1 */
                                   /* Times the M.F., Plus 1 */
    T[i] = (XI[i]+YI[i])/64;       /* Clip to Plus 64 */ if ( T[i] >= 48 )          /* format data for correct ASCII Hex output */
            {
            MT = T[i] - 32;        /* 16 to 32 */
            printf("\n%2X ", MT);
            }
        if ( (T[i] >= 32) && (T[i] < 48) )
            {
            MT = T[i] - 32;        /* 0 to 15 */
            printf("\n0%X ", MT);
            }
        if ( T[i] < 32 )
            {
            T[i] = T[i] - 32;      /* -1 to -32 */
            printf("\n%X ", T[i]);
            }
    }
```

/* Initialize for 3 bit triangular dither */

```
K = 109;            /* Set K multiplier */
K2 = 109;           /* Set K2 multiplier */
```

```
M = 2048;                    /* Set Length of sequence */
XI[0] = 2011;                /* Initialize The Random Sequence */
YI[0] = 112;                 /* Initialize second random sequence */

J = 4*K+1;                   /* Calculate Multiplier Factor M.F. 1 */
J2 = 4*K2 +1;                /* Calculate Multiplier Factor M.F. 2 */

T[0] = ((XI[0]+YI[0])/256 - 8);    /* Calculate first random number */ printf ("\n\n$A1800,");      /* Page 4 start address formating */ printf("\n0%X ", T[0]);      /* Print First Random Number */ for (i = 1; i < M; i++)
        {
        XI[i] = (J*XI[i-1] + 1)%M;    /* Modulus of Previous Random Number 1 */
                                     /* Times the M.F., Plus 1 */
        YI[i] = (J2*YI[i-1] + 1)%M;   /* Modulus of Previous Random Number 1 */
                                     /* Times the M.F., Plus 1 */
        T[i] = (XI[i]+YI[i])/256;    /* Clip to Plus 16 */ if ( T[i] >= 8 )     /* format data for correct ASCII Hex output */
                {
                MT = T[i] - 8;       /* 0 to 8 */
                printf("\n0%X ", MT);
                }
        if ( T[i] < 8 )
                {
                T[i] = T[i] - 8;     /* -1 to -8 */
                printf("\n%X ", T[i]);
                }
        } printf("\3\n$SF1D8,\n");     /* sum check for Data I/O */
}
```

Appendix B

```
#include <stdio.h>

/*                      randsub.c                              */ main ()         /* Calculates: +16 / -15 count and a +4 /-3 count rectangular and */
                /* a + / - 32 count, and a + / - 16 count trianglar linear congruential */
```

/* random number with a sequence length of M for subtraction. */

/* Usage : -> randsub > ofile */

/* Output is formated for download to a Unisite 40 Prom Programmer. */

```c
{
    int M;                  /* Sequence Period */
    int J;                  /* Calculated multiplier factor 1 */
    int J2;                 /* Calculated Multiplier factor 2 */
    int K;                  /* K multiplier factor 1 */
    int K2;                 /* K multiplier factor 2 */
    int XI[2048];           /* The Random Number in 11 bit resolution */
    int i;                  /* Index For the Random Number */
    unsigned char R[2048];  /* The Random Number rectangular to + and - X counts */
    unsigned char MR;       /* Temporary Register */ int YI[2048];           /* The Random Number in 11 bit resolution */
    unsigned char T[2048];  /* The Random Number trangular to + and - X counts */
    unsigned char MT;       /* Temporary Register */

/* Initialization for rectangular 1 bit */

K = 109;                /* Set K multiplier */
    M = 2048;               /* Set Length of sequence */
    XI[0] = 2011;           /* Initialize The Random Sequence */

J = 4*K+1;              /* Calculate Multiplier Factor M.F. */

R[0] = -(XI[0]/(M/32) - 16);  /* Calculate first random number */
                                  /* and save it to output last */ printf("\2$A0000,");    /* Start formatting data for ASCII Hex space STX */
                            /* Unisite format 50 */
for (i = 1; i < M; i++)
    {
    XI[i] = (J*XI[i-1] + 1)%M;   /* Modulus of Previous Random Number */
                                 /* Times the M.F., Plus 1 */
    R[i] = XI[i]/(M/32);         /* Clip to Plus 31 */ if ( R[i] > 16 )    /* format data for correct ASCII Hex output */
        {
        MT = -(R[i] - 16);       /* -1 to -15 */
        printf("\n%X ", MT);
        }
```

```
if ( (R[i] <= 16) && (R[i] >= 1) )
        {
        MT = -(R[i] - 16);         /* 0 to 15 */
        printf("\n0%X ", MT);
        }
if ( R[i] < 1 )
        {
        R[i] = -(R[i] - 16);       /* 16 */
        printf("\n%2X ", R[i]);
        }
} printf("\n%X ", R[0]);      /* Print First Random Number - last */

/* Initialization for rectangular 3 bit*/

K = 109;              /* Set K multiplier */
M = 2048;             /* Set Length of sequence */
XI[0] = 2011;         /* Initialize The Random Sequence */

J = 4*K+1;            /* Calculate Multiplier Factor */

R[0] = -(XI[0]/(M/8) - 4);    /* Calculate first random number and save it */ printf ("\n\n$A0800,");       /* Start address for 2nd page */ for (i = 1; i < M; i++)
        {
        XI[i] = (J*XI[i-1] + 1)%M;    /* Modulus of Previous Random Number */
                                      /* Times the M.F., Plus 1 */
        R[i] = XI[i]/(M/8);           /* Clip to Plus 7 */
        if ( R[i] > 4 )
                {
                MT = -(R[i] - 4);     /* -1 to -3 */
                printf("\n%X ", MT);
                }
        if ( R[i] <= 4 )
                {
                R[i] = -(R[i] - 4);   /* 0 to 4 */
                printf("\n0%X ", R[i]);
                }
        } printf("\n%X ", R[0]);       /* Write 1st data word - Last */

/* Initialize for 1 bit triangular dither */
```

```
K = 109;              /* Set K multiplier */
K2 = 507;             /* Set K2 multiplier */
M = 2048;             /* Set Length of sequence */
XI[0] = 2011;         /* Initialize The Random Sequence */
YI[0] = 112;          /* Initialize second random sequence */

J = 4*K+1;            /* Calculate Multiplier Factor M.F. 1 */
J2' = 4*K2 +1;        /* Calculate Multiplier Factor M.F. 2 */

T[0] = -((XI[0]+YI[0])/64 - 32);    /* Calculate first random number */ printf ("\n\n$A1000,");             /* Start address for 3rd page */ for (i = 1; i < M; i++)
    {
    XI[i] = (J*XI[i-1] + 1)%M;      /* Modulus of Previous Random Number 1 */
                                    /* Times the M.F., Plus 1 */
    YI[i] = (J2*YI[i-1] + 1)%M;     /* Modulus of Previous Random Number 1 */
                                    /* Times the M.F., Plus 1 */
    T[i] = (XI[i]+YI[i])/64 ;       /* Clip to Plus 64 */ if ( T[i] <= 16 )           /* format data for correct ASCII Hex output */
            {
            MT = -(T[i] - 32);      /* 16 to 32 */
            printf("\n%2X ", MT);
            }
        if ( (T[i] <= 32) && (T[i] > 16) )
            {
            MT = -(T[i] - 32);      /* 0 to 15 */
            printf("\n0%X ", MT);
            }
        if ( T[i] > 32 )
            {
            T[i] = -(T[i] - 32);    /* -1 to -32 */
            printf("\n%X ", T[i]);
            }
    } printf("\n%X ", T[0]);          /* Print First Random Number - last */

/* Initialize for 3 bit triangular dither */

K = 109;              /* Set K multiplier */
K2 = 109;             /* Set K2 multiplier */
M = 2048;             /* Set Length of sequence */
XI[0] = 2011;         /* Initialize The Random Sequence */
YI[0] = 112;          /* Initialize second random sequence */
```

```c
J = 4*K+1;              /* Calculate Multiplier Factor M.F. 1 */
J2 = 4*K2 +1;           /* Calculate Multiplier Factor M.F. 2 */

T[0] = -((XI[0]+YI[0])/256 - 8);    /* Calculate first random number */ printf ("\n\n$A1800,");             /* Page 4 start address formating */ for (i = 1; i < M; i++)
    {
        XI[i] = (J*XI[i-1] + 1)%M;  /* Modulus of Previous Random Number 1 */
                                    /* Times the M.F., Plus 1 */
        YI[i] = (J2*YI[i-1] + 1)%M; /* Modulus of Previous Random Number 1 */
                                    /* Times the M.F., Plus 1 */
        T[i] = (XI[i]+YI[i])/256;   /* Clip to Plus 16 */ if ( T[i] > 8 )             /* format data for correct ASCII Hex output */
            {
                MT = -(T[i] - 8);   /* -1 to -8 */
                printf("\n%X ", MT);
            }
        if ( T[i] <= 8 )
            {
                T[i] = -(T[i] - 8); /* 0 to 8 */
                printf("\n0%X ", T[i]);
            }
    } printf("\n0%X ", T[0]);             /* Print First Random Number - last */
printf("\3\n$S9D28,\n");            /* sum check for Data I/O */
}
```

Appendix A

```c
#include <stdio.h>

/*                      random.c                      */ main ()     /* Calculates: +15 / -16 count and a +3 /-4 count rectangular and */
            /* a + / - 32 count, and a + / - 16 count trianglar linear congruential */
            /* random number with a sequence length of M. */

/* Usage : -> random > ofile */

/* Output is formated for download to a Unisite 40 Prom Programmer. */
```

```c
{
    int M;                      /* Sequence Period */
    int J;                      /* Calculated multiplier factor 1 */
    int J2;                     /* Calculated Multiplier factor 2 */
    int K;                      /* K multiplier factor 1 */
    int K2;                     /* K multiplier factor 2 */
    int XI[2048];               /* The Random Number in 11 bit resolution */
    int i;                      /* Index For the Random Number */
    unsigned char R[2048];      /* The Random Number rectangular to + and - X counts */
    unsigned char MR;           /* Temporary Register */ int YI[2048];               /* The Random Number in 11 bit resolution */
    unsigned char T[2048];      /* The Random Number trangular to + and - X counts */
    unsigned char MT;           /* Temporary Register */

/* Initialization for rectangular 1 bit */

K = 109;                    /* Set K multiplier */
    M = 2048;                   /* Set Length of sequence */
    XI[0] = 2011;               /* Initialize The Random Sequence */

J = 4*K+1;                  /* Calculate Multiplier Factor M.F. */

R[0] = XI[0]/(M/32) - 16;   /* Calculate first random number */ printf ("\2$A0000,");       /* Start formatting data for ASCII Hex space STX */
                                /* Unisite format 50 */ printf("\n0%X ", R[0]);     /* Print First Random Number */
```

What is claimed is:

1. A circuit for faithfully converting an analog audio or like data signal into an equivalent digital signal, said circuit having a first clock signal of a first predetermined frequency provided thereto, said circuit comprising:

means for receiving said analog audio or like data signal and then converting said analog audio or like data signal into said equivalent digital signal;

said equivalent digital signal having a plurality of digital data samples, each of said digital data samples having a plurality of data bits;

first counting means responsive to said first clock signal providing a second clock signal having a second predetermined frequency, and a plurality of digital addresses;

said second clock signal being supplied to said converting means so as to effect the frequency at which said converting means samples said analog audio or like data signal;

first random number generating means responsive to each of said digital addresses provided by said first counting means generating a random binary number, each of said random binary numbers generated by said first random number generating means being the dither component to be added to one digital data sample of said digital equivalent signal, said first random number generating means providing for each random binary number generated thereby a sign bit indicative of whether said random binary number is positive or negative;

first adding means for adding said dither components to said digital data samples of said equivalent digital signal and for eliminating at least one bit from each digital data sample with dither added thereto, said first adding means providing a carry bit indicative of when the magnitude of any of said digital data samples with dither added thereto exceeds the maximum value of the binary number which may be provided by said first adding means after said first adding means adds said dither component to said digital data sample;

first clipping circuit means for receiving each digital data sample of said equivalent data signal from said first adding means, said first clipping circuit means responsive to said carry bit provided by said first adding means and said sign bit provided by said first random number generating means allowing said digital data sample to pass therethrough or setting each data bit of said digital data sample to a predetermined logic state;

second counting means responsive to said first clock signal providing a plurality of digital addresses, said plurality of digital addresses provided by said second counting means being synchronized with said plurality of digital addresses provided by said first counting means;

second random number generating means responsive to each of said digital addresses provided by said second counting means generating a random binary number, each of said random binary numbers generated by said second random number generating means being the twos complement of one of the dither components added to said equivalent digital signal by said first adding means, said second random number generating means providing for each random binary number generated thereby a sign bit indicative of whether said random binary number is positive or negative;

second adding means for adding said binary numbers generated by said second random number generating means to said digital data samples of said equivalent digital signal thereby eliminating the dither component from each digital data sample of said equivalent digital signal, said second adding means providing a carry bit indicative of when the magnitude of any of said digital data samples with dither removed therefrom exceeds the maximum value of the binary number which may be provided by said second adding means after said second adding means removes said dither component from said digital data sample; and second clipping circuit means for receiving each digital data sample of said equivalent data signal from said second adding means, said second clipping circuit means responsive to said carry bit provided by said second adding means and said sign bit provided by said second random number generating means allowing said digital data sample to pass therethrough or setting each data bit of said digital data sample to a predetermined logic state.

2. The circuit of claim 1 wherein said converting means comprises an analog to digital converter.

3. The circuit of claim 1 wherein said first and second counting means each comprises an asynchronous twelve bit counter.

4. The circuit of claim 1 wherein said first and second random number generating means each comprises a programmable read only memory.

5. The circuit of claim 1 wherein said first adding means comprises first and second four bit binary full adders, said first adder having a carry output and said second adder having a carry input, the carry output of said first adder being connected to the carry input of said second adder.

6. The circuit of claim 1 wherein said first clipping circuit means comprises:

a first inverter having an input adapted to receive the carry bit from said first adding means and an output;

a first OR gate having a first input connected to the output of said first inverter, a second input adapted to receive the sign bit from said first random number generating means and an output;

a first AND gate having a first input connected to the output of said first inverter, a second input adapted to receive the sign bit from said first random number generating means and an output;

a second inverter having an input connected to the output of said first OR gate and an output;

a third inverter having an input connected to the output of said first AND gate and an output;

second, third and fourth OR gates, each of said second, third and fourth OR gates having a first input connected to the output of said second inverter, a second input adapted to receive one of the data bits of said equivalent digital signal from said first random number generating means and an output; and second, third and fourth AND gates, each of said second, third and fourth AND gates having a first input connected to the output of said third inverter, a second input connected to the output of one of said second, third or fourth OR gates and an output connected to said second adding means.

7. The circuit of claim 1 wherein said second adding means comprises a four bit binary full adder.

8. The circuit of claim 6 wherein said second clipping circuit means is further characterized by:

sixth and seventh OR gates, each of said sixth and seventh OR gates having a first input connected to the output of said second inverter, a second input connected to said second random number generating means and an output; and sixth and seventh AND gates, said sixth and seventh AND gates each having a first input connected to the output of said third inverter, said sixth AND gate having a second input connected to the output of said sixth OR gate and said seventh AND gate having a second input connected to the output of said seventh OR gate.

9. The circuit of claim 1 wherein said second clipping means comprises:

a first inverter having an input adapted to receive the carry bit from said second adding means and an output;

a first OR gate having a first input connected to the output of said first inverter, a second input adapted to receive the sign bit from said second random number generating means and an output;

a first AND gate having a first input connected to the output of said first inverter, a second input adapted to receive the sign bit from said second random number generating means and an output;

a second inverter having an input connected to the output of said first OR gate and an output;

a third inverter having an input connected to the output of said first AND gate and an output;

second, third, fourth and fifth OR gates, each of said second, third fourth and fifth OR gates having a first input connected to the output of said second inverter, a second input adapted to receive one of the data bits of said equivalent digital signal from said second adding means and an output; and second, third, fourth and fifth AND gates, each of said second, third, fourth and fifth AND gates having a first input connected to the output of said third inverter and a second input connected to the output of one of said second, third, fourth or fifth OR gates.

10. The circuit of claim 1 further characterized by a digital to analog converter electrically connected to said second clipping circuit means, said digital to analog converter being adapted to receive said digital equivalent signal from said second clipping circuit means and convert said digital equivalent signal to an equivalent analog signal which is a replica of said analog audio or like data signal received by said converter means.

* * * * *